(12) United States Patent
Master et al.

(10) Patent No.: US 6,632,690 B2
(45) Date of Patent: Oct. 14, 2003

(54) METHOD OF FABRICATING RELIABLE LAMINATE FLIP-CHIP ASSEMBLY

(75) Inventors: Raj N. Master, San Jose, CA (US); Edward S. Alcid, Sunnyvale, CA (US); Diong-Hing Ding, Penang (MY)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/062,407

(22) Filed: Feb. 5, 2002

(65) Prior Publication Data
US 2003/0077852 A1 Apr. 24, 2003

Related U.S. Application Data
(60) Provisional application No. 60/317,968, filed on Sep. 10, 2001.

(51) Int. Cl.[7] .............................................. G01R 31/26
(52) U.S. Cl. ................................................. 438/15; 438/15
(58) Field of Search ................... 438/15, 108, 126, 438/127

(56) References Cited

U.S. PATENT DOCUMENTS 4,890,152 A * 12/1989 Hirata et al. ................ 257/666
5,889,332 A * 3/1999 Lawson et al. .............. 257/778
6,074,895 A * 6/2000 Dery et al. .................. 438/108
6,150,724 A * 11/2000 Wenzel et al. .............. 257/777

OTHER PUBLICATIONS

Derwent Abstracted Publication No. JP10209206A "Semiconductor device manufacturing method . . . height of flip chip." Nippondenso Co. Ltd. Aug. 7, 1998. (Abstract Only).*

Japanese Abstacted Application No. JP08175153. "Resin method for transferring bumps in flip chip mounting" Kokusai Electric Co. Ltd. Jan. 23, 1998.*

* cited by examiner

Primary Examiner—Craig Thompson

(57) ABSTRACT

A method of fabricating laminate assemblies determines the ideal weight (W) of underfill to be dispensed, based on the size of the semiconductor die and the gap between the die and the laminate substrate. Underfill is dispensed in a single step in an amount between 1.1W and 1.3W to form fillets that cover at least 15% of the height of the semiconductor die on all four sides of the die. The amount of underfill ensures that the fillet coverage imbalance is 30% or less for each of the pairs of opposing sides of the die, thereby improving solder joint reliability.

8 Claims, 2 Drawing Sheets

METHOD OF FABRICATING RELIABLE LAMINATE FLIP-CHIP ASSEMBLY

This application contains subject matter related to the subject matter disclosed in copending U.S. Provisional Patent Application Serial No. 60/317,968 filed on Sep. 10, 2001.

FIELD OF THE INVENTION

The present invention relates to the field of forming a package assembly, and more particularly, to a method of underfilling that improves the solder joint reliability in a semiconductor package assembly.

BACKGROUND OF THE INVENTION

A commonly used method to attach silicon chips to laminate substrates, or packages, is known as flip-chip bonding. One such process is the controlled columnar collapsed connection (C4) technique. Typically, a semiconductor die or flip-chip is provided with a pattern of solder bumps or balls on an underside or circuit side thereof. The solder balls are registered with plated or screen printed solder pads on the laminate substrate. Flux is normally supplied between the solder balls and solder pads. Upon heating, the solder pads on the substrate reflow and physically connect with the solder balls on the underside of the chip.

Since a flip-chip is not necessarily encapsulated in a plastic or ceramic package, the connections between the substrate and the chip can fatigue. Fatiguing is the cause of solder joint failure. To prevent this fatigue, a special liquid epoxy is allowed to flow and completely cover the underside of the chip. This is referred to as the "underfill" operation. Upon curing, the resulting encapsulation serves to prevent fatiguing of the electrical interconnects between the laminate substrate and the chip. The epoxy also serves to protect the bonds between a deformed solder pad and solder balls by providing thermal stress relief, i.e. accommodating differential rates of thermal expansion and contraction. This is needed because the laminate substrate can be an organic package that has a much different co-efficient of thermal expansion than the silicon chip. During actual operation of the device, the thermal stresses created cause both the silicon chip and the organic package to be heated. Due to the high thermal mismatch, the thermal stresses make the thermal stress relief provided by underfill a necessity.

In order to ensure continued solder joint reliability, enough of the underfill material needs to be dispensed to form fillets on the sides of the semiconductor die. Ideally, such fillets cover the entire sides, of each of the four sides of the semiconductor die. However, such 100% coverage of the sides of the semiconductor die by the fillets has been difficult to achieve in practice. Some attempts have been made to employ molds, but these methods have proven to be unsuccessful. Another method has been to provide multiple dispensing steps to underfill underneath the semiconductor die and to complete the filling and formation of the fillets in a separate dispensing step. This process has proven unwieldy, and involves expensive extra processing steps that increase the costs of manufacture.

A single dispensing step is desirable, but the final product produced by single dispensing techniques in the past have problems. Referring to FIG. 1, which depicts a final product obtained through the use of a single dispensing step, the package assembly 10 includes an organic package 12 to which a semiconductor die 14 is attached, either through a ball grid array 16 or a pin grid array 16. Underfill 18 has been dispensed in the gap between the semiconductor die 14 and the package 12. The dispensing of the underfill 18 is typically performed at a single one of the four sides on the semiconductor die 14. An "ideal weight" of underfill is normally dispensed. The ideal weight of the underfill 18 is determined based upon the volume of the gap between the semiconductor die 14 and the package 12. Hence, the volume is the square area of the semiconductor die 14 multiplied by the height of the gap between the semiconductor die 14 and the package 12.

Dispensing the underfill 18 at one side of the semiconductor die 14 creates a build-up of the underfill 18 at that side, forming a fillet 20 that substantially completely covers the side of the semiconductor die 14 at the dispensing side. Therefore, there is very little exposed surface 24 on that particular side. The fillets 22 on the other three sides of the semiconductor die 14, as depicted in FIG. 1, provide much less coverage of the other three sides. Exposed surface 26 is thus significantly larger than the exposed surface 24.

The imbalance in coverage of the sides of the semiconductor die 14 leads to unreliability in the solder joints. When the package assembly 10 undergoes thermal stress, delamination may occur since the semiconductor die 14 is not held as equally securely on the two opposing sides of the semiconductor die 14. In other words, when two opposing sides have very different sized exposed surfaces 24, 26, this imbalance of fillet coverage allows the semiconductor die 14 connection to be torqued in response to thermal stress. This leads to unreliability of the solder joint connections.

Hence, there is a problem in providing sufficient underfill on all four sides of a semiconductor die to assure solder joint reliability, but at the same time avoid extra processing steps and other unworkable solutions to form fillets and provide solder joint reliability.

SUMMARY OF THE INVENTION

These and other needs are met by embodiments of the present invention which provide a method for forming a package assembly, comprising the steps of attaching a semiconductor die to a package with a gap formed therebetween. Underfill is dispensed in a single step at a side of the semiconductor die and forms fillets. The semiconductor die has two pairs of opposing sides with a height H. The fillets cover at least 0.15H of each of the sides. The fillet coverage imbalance for the opposing sides of the respective pairs is less than 30%.

The inventors have determined that adequate solder joint reliability is achieved when the fillet coverage imbalance for each of the pairs of the opposing sides of the semiconductor die is less than 30%. Full fillet coverage (i.e. 100% coverage) of the sides of the semiconductor die is not necessary to provide solder joint reliability. However, the inventors have recognized that the avoidance of torque created by the thermal stress and excessive fillet coverage imbalance needs to be avoided. Also, the inventors have determined that coverage of at least 15% of each of the sides on the semiconductor die is necessary to achieve solder joint reliability.

In preferred embodiments of the invention, the ideal weight of underfill is determined, and the amount of underfill dispensed is equal to between 1.10 to 1.30 of the ideal weight of the underfill. This range of dispensing amount assures that the fillet coverage imbalance is less than 30% on the opposing sides of the respective pairs of the semiconductor die sides and that the fillets cover at least 0.15 of the height of the each of the sides of the semiconductor die.

The earlier stated needs are also met by an embodiment of the present invention which provides a method of forming a reliable laminate flip-chip assembly having a die and a package, and includes the steps of attaching the die to the package, a gap being formed between the die and the package, the gap having a volume. The method also includes determining the ideal weight W of underfill based on the volume; and dispensing underfill at one side of the die, the weight of underfill dispensed being between 1.1W to 1.3W.

The foregoing and other features, aspects and advantages of the present invention will become more apparent from the following detailed description of the present invention when taken in conjunction with the accompanying drawings.

DETAILED DESCRIPTION OF THE PRESENT INVENTION

The present invention addresses and solves problems related to delamination in a package assembly and cracking of the underfill, and provides an efficient and inexpensive method of dispensing underfill to assure solder joint reliability. This is achieved, in part, by determining the ideal weight W of the underfill based on the volume of the gap between a semiconductor die and a package assembly. Once the ideal weight W is determined, underfill is dispensed at one side of the die in a single dispensing step. The weight of the underfill, however, instead of being at the ideal weight, is dispensed between 1.10W to 1.30W, where W is the ideal weight. The use of 1.10W to 1.30W of underfill provides sufficient underfill material to form fillets that cover at least 15% of each of the sides of the semiconductor die. Also, the amount of underfill employed in the single dispensing step assures that a fillet coverage imbalance on opposing sides of the semiconductor die does not exceed 30%. This prevents excessive torque forces that lead to solder joint unreliability.

Figure 2:
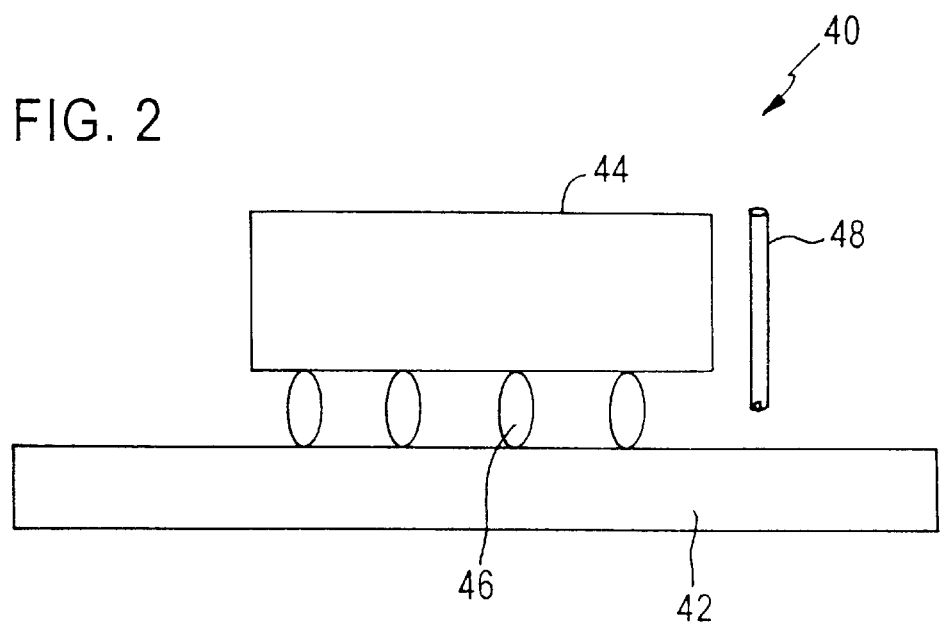
FIG. 2 depicts a side sectional view of a package assembly being formed in accordance with the embodiments of the present invention.

FIG. 2 depicts the package assembly 40 prior to the dispensing of underfill. A package 42, which is preferably an organic substrate, is connected to a semiconductor die 44 through electrical contacts 46. These electrical contacts 46 may be formed in a ball grid array or pin grid array, for example. A gap is formed between the package 42 and a semiconductor die 44. Although the present invention has particular utility for use with an organic package 42, due to the thermal mismatch between the organic material and the semiconductor die 44, the present invention can also be used with other types of substrates, such as ceramic substrates. In those packages, however, thermal mismatch is not as severe as with organic packages.

A dispensing needle 48 is provided at one of the sides of the semiconductor die 44 and package 42. The dispensing needle 48 dispenses the underfill that, through capillary action, fills the gap and forms fillets on the semiconductor die 44. The amount of underfill that is dispensed is typically determined as a weight. The ideal weight W is considered by those of ordinary skill in the art to be determined based on the volume of the gap between the semiconductor die 44 and the package 42. The volume of the gap is therefore based on the surface area of the bottom of the semiconductor die 44 and the height of the gap between the semiconductor die 44 and the height of the gap between the semiconductor die 44 and the package 42. Hence, once the ideal weight W is determined for a particular die size and gap height, the ideal weight W of underfill is dispensed from the dispensing needle 48 for each of the package assemblies 40 during production.

Figure 1:
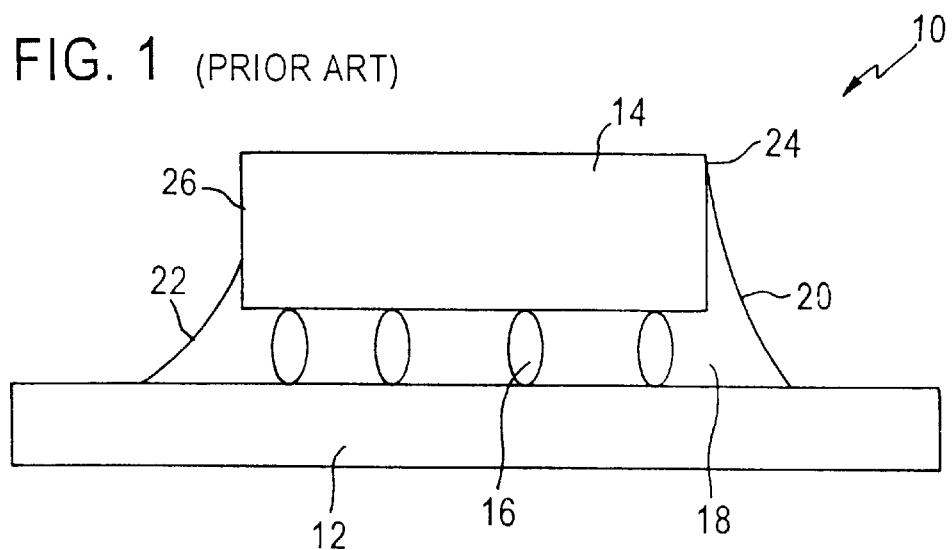
FIG. 1 is a schematic side sectional view of a package assembly formed in accordance with prior art methodologies.

As discussed earlier, dispensing underfill at a single side of a semiconductor die a single processing step may lead to fillet coverage imbalance, as earlier depicted in FIG. 1. This is due to the build-up of the underfill at the dispensing side of the semiconductor die 44. One of ordinary skill in the art may therefore be led to attempt to solve this problem by greatly increasing the amount of underfill, such as employing 2.0W of underfill (i.e. doubling the amount of underfill). However, this merely exacerbates the problem and does not solve the problem of imbalance.

Figure 3:
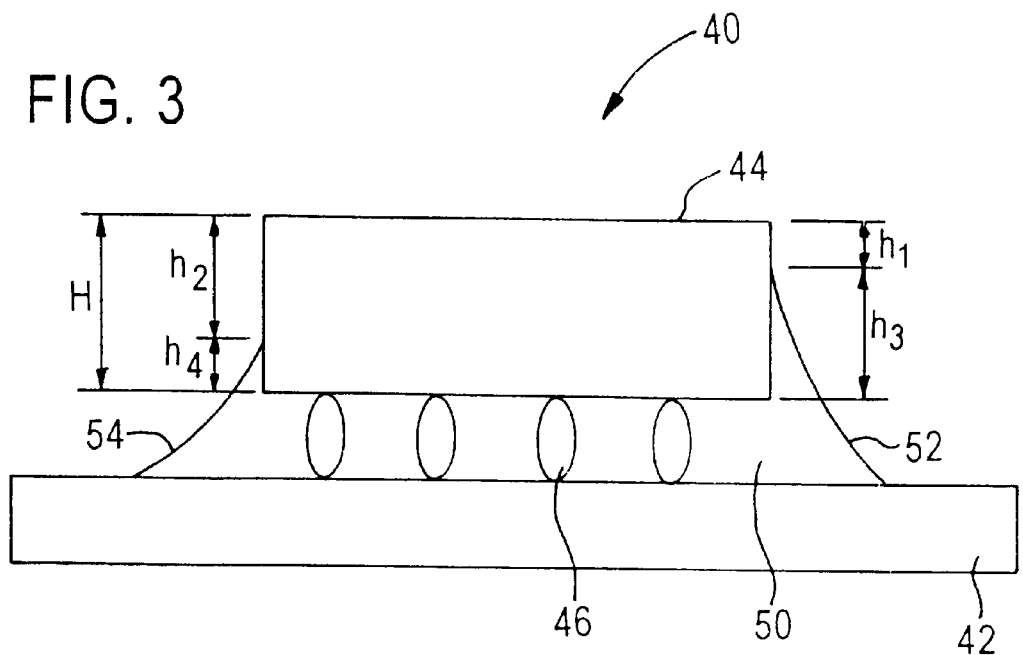
FIG. 3 is a side sectional view of the package assembly of FIG. 2, following the dispensing of the underfill in accordance with embodiments of the present invention.

Instead, embodiments of the present invention dispense 1.1W to 1.3W (i.e. 10 to 30% more) of the underfill through the dispensing needle 48. The result of this is depicted in FIG. 3.

The underfill 50 completely fills the volume of the gap between semiconductor die 44 and the package 42. Fillets 52 and 54 are formed on the respective sides $A_1$, $A_2$ of the semiconductor die 44, which has a height H. The height H of the exposed surface on side $A_1$ is $h_1$, with the amount of covered surface on side $A_1$ being $h_3$. Similarly, on side $A_2$, the exposed surface of the semiconductor die side has a height $h_2$, while the covered portion of the side has a height $h_4$.

Figure 4:
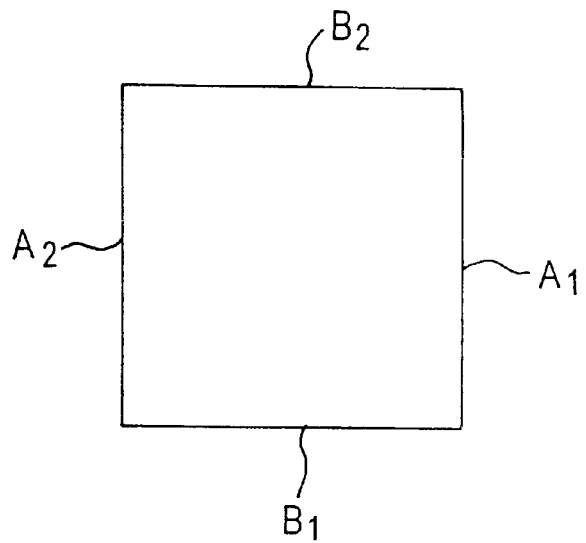
FIG. 4 is a top view of a semiconductor die, illustrating the two pairs of opposing sides.

The use of 1.1W to 1.3W of underfill 50 assures that $h_2/H$ and $h_4/H$ are each greater than 0.15H. In other words, the fillets 52 and 54 cover at least 15% of the height of the sides $A_1$, $A_2$, $B_1$, of the semiconductor die 44. Adverting to FIG. 4, two pairs of opposing sides are $A_1$, $A_2$ and $B_1$, $B_2$, respectively. The fillets cover 15% or more of each of these four sides of the semiconductor die 44.

In addition to ensuring that 15% of the sides the semiconductor die 44 are covered by the fillets 52, 54, the use of 1.1W to 1.3W of underfill 50 also ensures that the fillet coverage imbalance for opposing sides of the respective pairs is less than 30%. The fillet coverage imbalance I is equal to the height $h_2$ of the exposed surface of one of the opposing sides $A_2$ minus the height of the exposed surface $h_1$ of the other opposing side $A_1$ (of a pair of opposing sides), divided by the overall height H of the semiconductor die 44. Expressed as an equation, $$I = \frac{h_2 - h_1}{H}.$$

This number I needs to be less than 0.30 (i.e. 30%) to provide adequate solder joint reliability. An imbalance of less than 30% assures that the torque created during thermal stresses will not be so great as to reduce the solder joint reliability. Some amount of fillet coverage imbalance may occur, but as long as the imbalance is kept to 30% or less, adequate solder joint reliability is provided.

It is important that each of the pairs of opposing sides have fillet coverage imbalances of less than 30%. In other words, opposing sides $A_1$, $A_2$ should have a fillet coverage imbalance of less than 30%, and opposing sides $B_1$, $B_2$ also need to have a fillet coverage imbalance of 30% or less. The imbalance between sides $A_1$, $B_1$ or $A_2$, $B_2$ is not critical.

As stated above, the at least 15% coverage of each of the sides of the semiconductor die and the prevention of the fillet coverage imbalance being greater than 30% is provided by employing 1.1 to 1.3 times the ideal weight of underfill. This ensures sufficient solder joint reliability, while avoiding the addition of extra dispensing steps, attempting to seek full fillet coverage on all sides of a semiconductor die.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a reliable laminate flip-chip assembly having a die and a package, comprising the steps of:

attaching the die to the package, a gap being formed between the die and the package, the gap having a volume;

determining ideal weight (W) of the underfill based on the volume; and dispensing underfill at one side of the die, the weight of underfill dispensed being between 1.10W to 1.30W.

2. A method of forming a package assembly, comprising the steps of:

attaching a semiconductor die to a package with a gap formed therebetween; and dispensing underfill in a single step at a side of the semiconductor die to fill the gap and form fillets;

wherein the semiconductor die has two pairs of opposing sides with height H, the fillets covering at least 0.15H of each of the sides, and wherein fillet coverage imbalance for the opposing sides of the respective pairs is less than 30%; and wherein the step of dispensing includes dispensing between 1.10W to 1.30W of underfill, where W is an ideal weight of the underfill.

3. The method of claim 2, wherein the fillet coverage imbalance (I) is equal to a height ($h_2$) of an uncovered portion of a first one of the opposing sides minus a height ($h_1$) of an uncovered portion of a second one of the opposing sides, divided by the height (H) of the semiconductor die, such that $$I = \frac{h_2 - h_1}{H}.$$

4. The method of claim 2, wherein the ideal weight W is determined based on the volume of the gap between the semiconductor die and the package.

5. The method of claim 4, wherein the semiconductor die and the package are attached by a ball grid array.

6. The method of claim 4, wherein the semiconductor die and the package are attached by a pin grid array.

7. The method of claim 2, wherein the package is an organic package.

8. A The method of claim 2, wherein the underfill is dispensed by a needle at only one of the sides of the semiconductor die.

* * * * *